US 6,620,995 B2

(12) United States Patent
Vasylyev et al.

(10) Patent No.: US 6,620,995 B2
(45) Date of Patent: Sep. 16, 2003

(54) NON-IMAGING SYSTEM FOR RADIANT ENERGY FLUX TRANSFORMATION

(76) Inventors: Sergiy Victorovich Vasylyev, 1311 Lake Blvd., Davis, CA (US) 95616; Viktor Petrovych Vasylyev, 24 Levanevsky Str., Pokotilovka, Kharkiv (UA), 312140

(*) Notice: Subject to any disclaimer, the term of this patent is extended or adjusted under 35 U.S.C. 154(b) by 0 days.

(21) Appl. No.: 10/113,200

(22) Filed: Mar. 28, 2002

(65) Prior Publication Data

US 2002/0139414 A1 Oct. 3, 2002

Related U.S. Application Data

(60) Provisional application No. 60/279,631, filed on Mar. 30, 2001.

(51) Int. Cl.[7] .......................... H01L 31/052; F24J 2/12; F24J 2/10; F24J 2/15
(52) U.S. Cl. .................. 136/246; 136/259; 126/684; 126/685; 126/688; 126/690; 359/853; 359/850
(58) Field of Search ................... 136/246, 259; 126/684, 685, 688, 690; 359/853, 850

(56) References Cited

U.S. PATENT DOCUMENTS

| 3,058,394 A | 10/1962 | Edlin |
| 3,413,468 A | 11/1968 | Astheimer |
| 4,784,700 A | 11/1988 | Stern et al. |
| 5,002,379 A * | 3/1991 | Murtha ........................ 359/853 |
| 5,153,780 A | 10/1992 | Jorgensen et al. |
| 5,460,659 A | 10/1995 | Krut |
| 5,578,140 A * | 11/1996 | Yogev et al. ................ 136/246 |
| 2002/0075579 A1 * | 6/2002 | Vasylyev et al. ........... 359/853 |

FOREIGN PATENT DOCUMENTS

SU          1023270 A * 1/1982

OTHER PUBLICATIONS

Viktor Vasylyev, Sergiy Vasylyev, and Yury Tkach, A Novel Prospective Type of Solar Optics Configurations for High-–Heat Minefield Clearing, World Renewable Energy Congress V, Renewable Energy, 1998, A.A.M. Sayigh, ed., Part IV, p. 2344–2347.

* cited by examiner

Primary Examiner—Alan Diamond

(57) ABSTRACT

A non-imaging energy flux transformation system including a concentrator incorporating a set of nested, ring-like, concave reflective elements, and a receiver. The system efficiently concentrates radiant energy, such as sunlight, by means of focusing the energy striking the entrance aperture of concentrator to the receiver located on the side of concentrator's exit aperture. The mirrored surfaces of reflective elements having appropriate individual non-imaging profiles represented by curved and/or straight lines are positioned so that the energy portions reflected from individual surfaces are directed, focused, and superimposed on one another to cooperatively form a common focal region on the receiver. The receiver can be an energy absorbing device, a secondary energy concentrating transformer, or a flux homogenizer.

18 Claims, 5 Drawing Sheets

NON-IMAGING SYSTEM FOR RADIANT ENERGY FLUX TRANSFORMATION

CROSS-REFERENCE TO RELATED APPLICATIONS

This application claims the benefit of prior U.S. Provisional Patent Application Serial No. 60/279,631 filed Mar. 30, 2001.

BACKGROUND OF THE INVENTION

1. Field of the Invention

The present invention relates to a system for transformation of radiant energy from a remote energy source with an energy concentrating system. In particular, this invention relates to a method and design for collecting radiant energy from sunlight with a solar non-imaging concentrator to obtain optimum concentration for a given absorber shape.

2. Description of Prior Art

In the past, radiant energy concentrating devices have been used in space and on Earth to generate heat and electrical current from a light source such as the sun. However, because of the costs associated with capturing the sunlight in a widely useful form, solar energy has not approached its potential for becoming an important source of power. In particular, it is expensive in terms of capital cost to convert solar energy into electricity, substantially based on the complex manufacturing process involved in making efficient, high-precision solar concentrators with large apertures.

Systems are known for the generation of electrical power through the conversion of solar energy concentrated by a suitable refractor, such as a Fresnel lens, or a reflector, such as a parabolic dish system.

An approach is known where Fresnel lenses are used to collect and focus sunlight onto a photovoltaic array. These lenses are typically made of transparent acrylic sheets or optically clear silicone rubber materials. Glass materials can also be employed to provide structural strength of the design.

Despite the obvious advantages of the Fresnel lens, such as operational convenience due to forming the focal region on the concentrator's back side, this approach still has no less obvious shortcomings.

The refraction index of plastic materials is essentially limited thus restricting concentration power and efficiency of the system. Prior art refractive lenses are generally bulky and fragile, complicating their manufacturing and use. The use of glass increases the weight, cost, and damage vulnerability of the lens. Furthermore, transparent refractive materials are known to degrade over time, due to interacting with chemicals and ultraviolet radiation.

Parabolic dish concentrators having much more concentrating power require extremely accurate continuous reflective surfaces of a very large aperture to achieve acceptably high concentration of the solar energy. Thus the prior art parabolic dish systems are expensive and heavy, due to the requirements of high optical accuracy. Continuous-surface parabolic mirrors are also not readily adaptable to provide a desired irradiance distribution for the receiver/absorber. However, the ability to provide a uniform concentration level is of a great importance for concentrating photovoltaic systems.

In the past, a lot of efforts have been made to improve the parabolic trough concentrators and lower the costs for a solar power system. One reflective concentrator that is especially designed for PV applications is disclosed in Jorgensen et al., U.S. Pat. No. 5,153,780, 1992. According to the patent, a dish reflector providing relatively uniform energy distribution on a PV array and consisting of a plurality of concentric concave reflective elements positioned along a reference parabolic dish surface is described. The solution, however, does not allow to achieve high concentration ratio attainable by conventional parabolic dishes. Furthermore, it has been a general disadvantage of all conventional retroreflecting devices that the operational convenience and use of larger absorbers/accessories or secondary concentrating optics disposed on the path of incoming energy are essentially limited due to unavoidable shadowing of the incident flux.

Vasylyev, in USSR Patent No. SU 1023270, issued Jan. 28, 1982, discloses the multi-element radiant energy concentrator "Peresvet" consisting of a set of ring-like reflectors, each reflector having the shape of a truncated circular paraboloid and sharing a common focal point. The "Peresvet" concentrator, however, is not adapted for achieving maximum energy concentration or providing a uniform energy distribution in the concentrated flux.

The present invention presents a novel solution particularly well suitable for achieving record concentration levels and energy conversion efficiency, as well as obtaining the desired illumination of an energy conversion unit.

BRIEF SUMMARY OF THE INVENTION

In accordance with the present invention, the problems and shortcomings of the previously known systems are solved by a non-imaging system for radiant energy flux transformation comprising an energy concentrator incorporating a plurality of nested, ring-like reflective surfaces receiving the energy on the entrance aperture and focusing that energy to a receiver located on the side of exit aperture and disposed in energy receiving relation to at least one of said reflective surfaces.

Accordingly, one of the key objects and advantages of this invention is to provide improved energy collection and conversion system, said system uniquely combining Fresnel lens-like operation and dramatically improved concentration power and adaptability as compared to prior art systems. The invention can be essentially useful and greatly superior over conventional devices for solar energy applications by providing an improved device for converting the sunlight to heat and/or electricity so that the cost for use of solar energy is reduced.

According to one aspect of the invention, the non-imaging reflective surfaces of energy concentrator are designed and positioned to concentrate and direct the radiant energy toward a plurality of converging directions to form a common concentrated energy flux based on the superposition of concentrated energy fluxes reflected from individual reflective surfaces.

In accordance with another aspect of the invention, in a preferred embodiment, there is provided a reflective concentrator for collecting radiant energy in which reflective surfaces are designed and positioned to minimize screening and shadowing on other reflective surfaces.

According to yet another aspect of the invention there is provided an energy concentrator in which reflective surfaces have concave profiles represented by simple or compound segments of conical sections having parabolic, hyperbolic, circular, or elliptical shape. Furthermore, one or more reflective surfaces can be planar or have a profile represented by a set of straight lines approximating a curved shape. In addition, the profiles of reflective surfaces can be represented by segments of parametric curves or splines tailored to provide a desired illumination of the energy receiver.

Moreover, according to an embodiment of the invention, there is provided an energy concentrator in which one or more reflective surfaces is disposed in any one of a translated, a reversed and/or a rotated orientation relative to the others having the same basic arrangement.

According to further aspect of the invention, there is provided an energy receiver which can be used for receiving and converting the radiant energy to whatever useful type of energy. In particular, a receiver can be provided for collecting and converting sunlight to heat and/or electricity. The energy receiver can be a Stirling heat engine or an array of photovoltaic solar cells for generating electricity. Furthermore, the receiver can be associated with a secondary energy concentrator for further energy flux intensification or homogenization.

According to a still further aspect of the invention there is provided an energy flux transformation system further comprising at least one axle support for tracking the movement of the radiant energy source. Furthermore, the energy receiver can be mechanically separated from the energy concentrator.

Additional aspects, objects, and advantages of the present invention will be apparent to persons skilled in the art from a study of the following description and the accompanying drawings, which are hereby incorporated in and constitute a part of this specification.

DRAWING FIGURES

DETAILED DESCRIPTION OF THE INVENTION

The preferred embodiments of energy transformation systems selected for the purpose of illustrating the invention include a system for collecting solar energy comprising a multi-element energy concentrator and a receiver.

Figure 1:
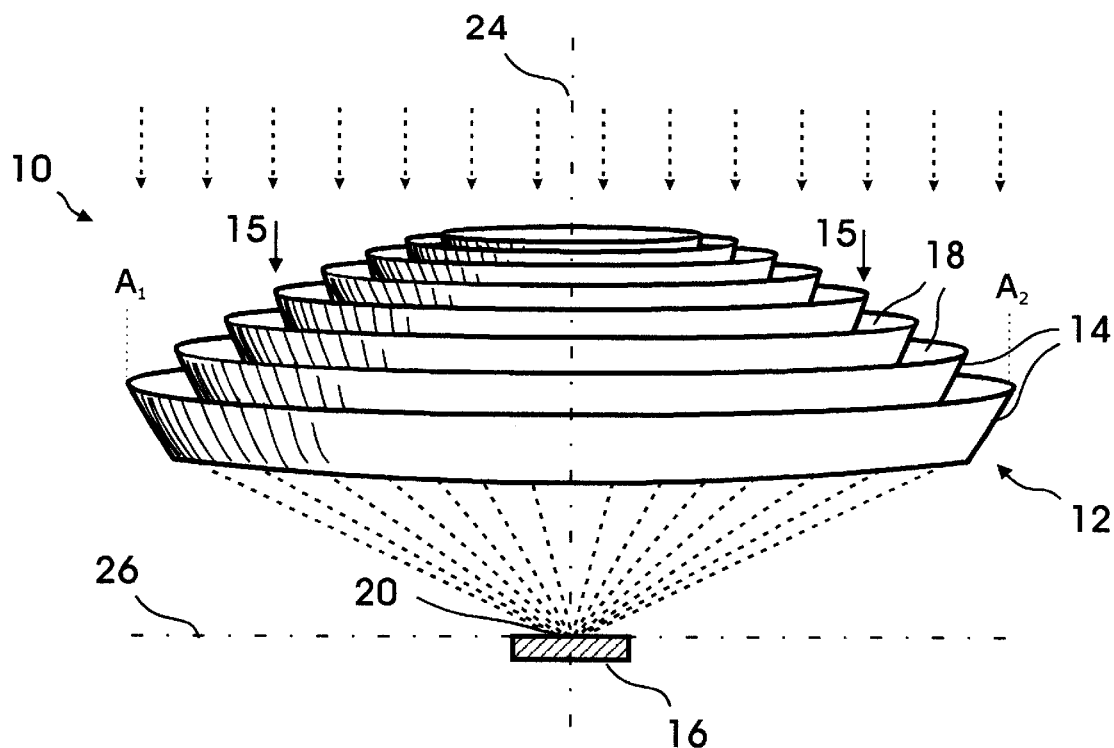
FIG. 1 shows a perspective schematic view of the non-imaging system for radiant energy flux transformation in accordance with the present invention.

FIG. 1 shows in general a system 10 for collecting radiant solar energy according to a preferred embodiment. System 10 includes a non-imaging concentrator 12 comprising a plurality of coaxial ring-like elements 14 having inner reflective surfaces 18, and a receiver 16 for receiving the concentrated energy from concentrator 12 for further energy collection and/or utilization.

Each surface 18 is an open surface of revolution obtained by rotation of an off-axis concave segment of a parabolic curve around a preselected axis to form a truncated cone-like structure. Elements 14 are disposed so that larger rims of corresponding surfaces 18 are facing the energy source to provide energy collection capabilities for elements 14. Accordingly, while each of surfaces 18 has its individual entrance and exit apertures, the larger and smaller rims of uttermost surface 18 define an entrance aperture and an exit aperture of concentrator 12, respectively. The entrance aperture of concentrator 12, indicated by lines $A_1$ and $A_2$, is acting as a radiant energy inlet, and the exit aperture is acting as a radiant energy outlet.

Elements 14 are confined between lateral surfaces of imaginary coaxial cylinders (not shown) which common longitudinal axis coincides with the axis of symmetry 24 of concentrator 12 to form a stepped arrangement providing mutual non-screening for the incident solar radiation. Accordingly, elements 14 are also arranged along axis 24 so as not to intercept the concentrated energy flux.

Surfaces 18 receive radiant energy from the sun on the entrance aperture of concentrator 12 and reflect that energy downward to form a common concentrated energy spot 20 on target plane 26 where the energy is received by receiver 16. Energy spot 20 is hereby formed by superposition of energy portions reflected from individual surfaces 18. The sizes of receiver 16 and energy spot 20 are selected so that receiver 16 intercepts at least a substantial part of energy collected in energy spot 20.

Receiver 16 can be a secondary energy concentrating system of a known type. For example, it can be a lens, truncated conical mirror, trumpet or funnel with inner reflective surface, or any other concentrator created by rotating the curved two-dimensional design around its axis and which is tailored to bring the concentrated flux from an entrance aperture to a target exit aperture of smaller diameter to achieve additional flux intensification.

Receiver 16 can also be associated with an energy absorber for converting the concentrated solar flux to whatever useful type of energy or attached to a light piping system which transfers the concentrated energy to an absorbing system where the energy is finally utilized.

Surfaces 18 can be tailored to provide a desired flux level and energy profile for energy spot 20. The key feature of the invention resides in selection of individual generatrices for the profiles of surfaces 18 in order to provide a specific energy distribution for the concentrated energy flux formed by the plurality of elements 14. For example, in case of parabolic profiles of surfaces 18, the concentrated flux from an individual surface 18 can be intercepted by receiver 16 at a point which is different from the focal point of the corresponding generatrix of surface 18.

In other words, the invention, according to a preferred embodiment, lies in treating each element 14 of the multi-element non-imaging concentrator 12 as a separate energy collector which, however, works cooperatively with the other elements 14 of the concentrator to provide a desired illumination for receiver 16.

Figure 2:
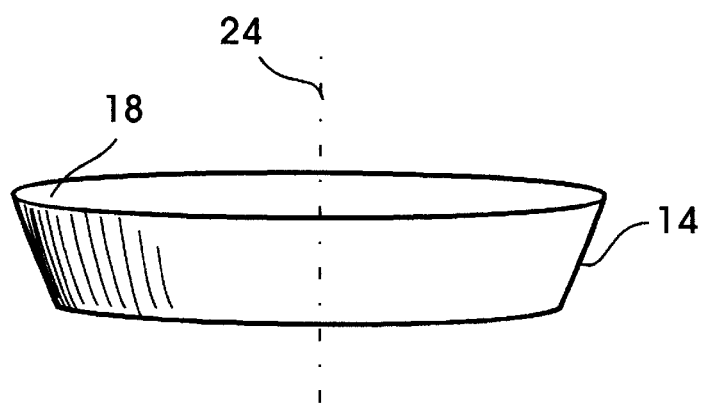
FIG. 2 is a perspective schematic view of a reflecting element of the system shown in FIG. 1.

FIG. 2 shows a perspective view of the concave element 14 indicated by the line 15—15 in FIG. 1. The manner in which generatrices of surfaces 18 can be selected will be explained by the three following examples.

EXAMPLE 1

Figure 3:
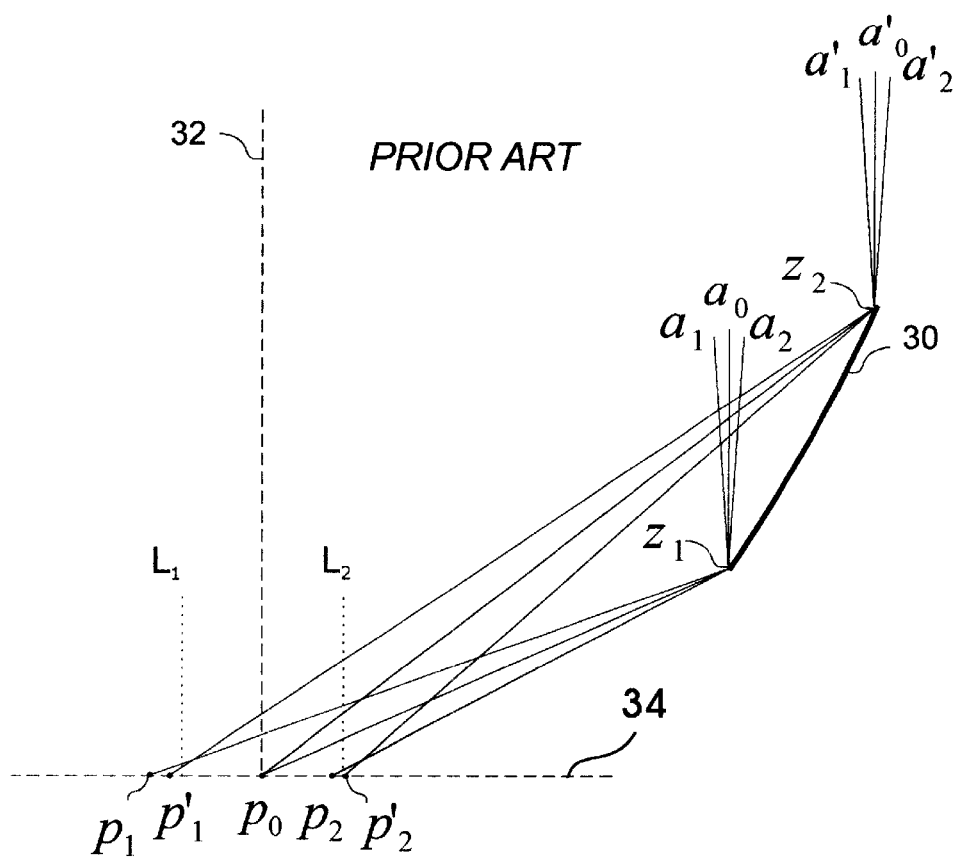
FIG. 3 is a schematic view of a prior art reflector profile illustrating light collection by a member of a set of confocal paraboloidal rings.

Referring to FIG. 3, there is shown a generatrix of an individual paraboloidal element of the multi-element radiant energy concentrator "Peresvet" consisting of a set of confocal truncated paraboloids and disclosed in Vasylyev (1982), USSR Patent # SU 1023270, the disclosure of which is hereby incorporated by reference herein in its entirety. The manner in which such a truncated circular paraboloid collects off-axis rays in its focal zone will first be considered.

In FIG. 3, $a_0$ and $a'_0$ represent parallel rays of light from a nodal point of a distant energy source (not shown) striking edge zones $z_1$ and $z_2$ of a truncated paraboloid 30, respectively. Accordingly, $a_1$, $a'_1$, $a_2$, and $a'_2$ represent parallel rays from two distant points corresponding to the angular size of the energy source so that rays $a_1$ and $a_2$ strike zone $z_1$, and rays $a'_1$ and $a'_2$ strike zone z Obviously, on-axis rays $a_0$ and $a'_0$ parallel to the optical axis 32 of paraboloid 30 are reflected to the focal point $p_0$ of the paraboloid. Off-axis rays $a_1$, $a_2$, $a'_1$, and $a'_2$ are focused at points $p_1$, $p_2$, $p'_1$, and $p'_2$ respectively, as shown in FIG. 3. In the focal plane 34, point $p_1$ is farther from point $p_0$ than point $p_2$, and point $p'_1$ is farther from point $p_0$ than point $p'_2$, as a matter of geometry. In the example shown, the farthest point $p_1$ determines the minimum size of the coma-distorted focal spot of the energy source formed by the truncated parabolid 30. In the case of relatively small absorber with the size indicated by lines $L_1$ and $L_2$, some rays will miss the absorber thus resulting in concentration decrease.

Clearly, the difference in distances from the focal point to points of interception of rays corresponding to the angular size of the energy source increases as more remote from optical axis paraboloids of the conventional "Peresvet" device are considered. It is obvious that if this difference could be reduced especially for peripheral paraboloids, focusing for off-axis rays would be improved and the concentrated energy spot would become smaller, resulting in increased concentration.

It will be appreciated by those skilled in the art that, for example, in solar energy concentrating devices, actual energy concentration level is considered rather than device capability to form crisp images.

Figure 4:
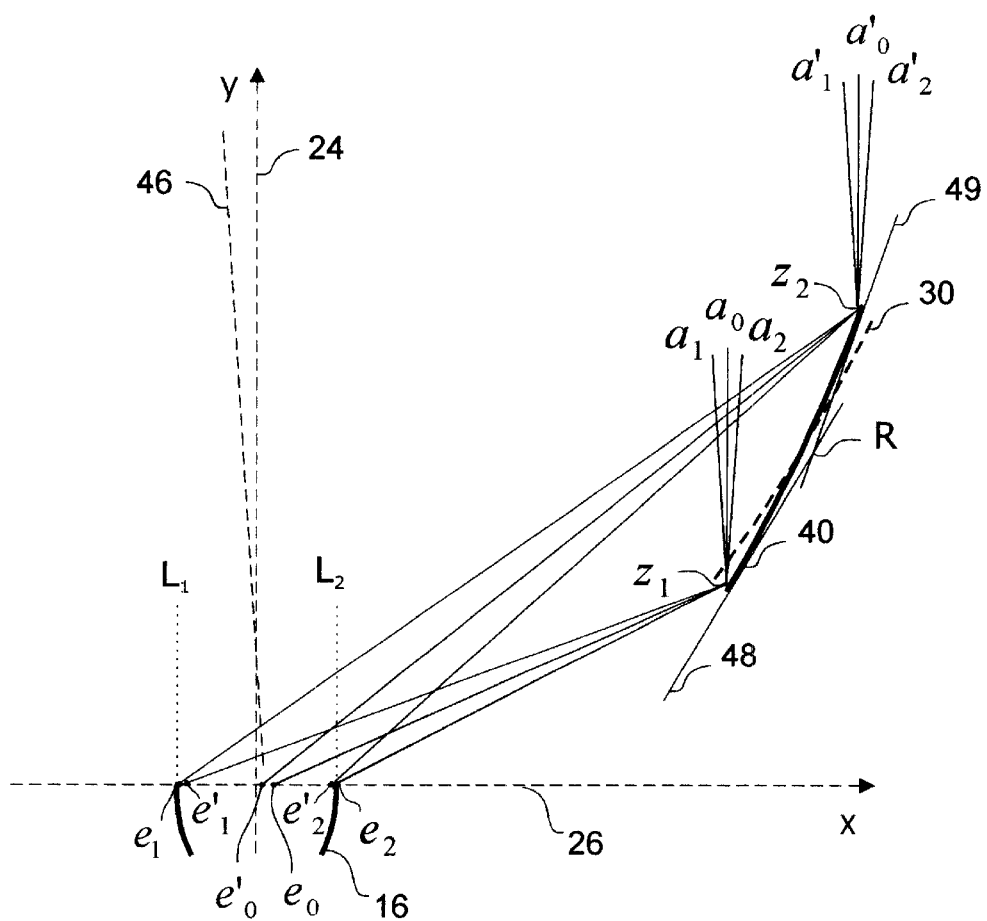
FIG. 4 is a schematic diagram showing the principles of energy flux transformation in accordance with the present invention.

FIG. 4 more fully illustrates operation of system 10 as a solar collecting system for obtaining better energy concentration for a given size of receiver 16 by improving the concentration of off-axis rays. The improvement, which is not attainable with a conventional device employing a set of confocal truncated paraboloids, is achieved by selecting non-imaging parabolic profiles for reflective surfaces 18 of reflecting elements 14.

In FIG. 4, a parabolic generatrix 40 of non-imaging reflective surface 18 is shown. Generatrix 40 can be a segment of a parabola (not shown) described by a second-order parametric equation. The shape of generatrix 40 can also be defined by two end tangents 48 and 49 of the corresponding parabolic segment and the following two parametric equations in the Cartesian xy coordinates:

$$x(t)=(x_2-2R_x+x_1)t^2+2(R_x-x_1)t+x_1$$

$$y(t)=(y_2-2R_y+x_2)t^2+2(R_y-x_2)t+x_2 \quad 0 \leq t \leq 1,$$

where t is the parameter, $z_1=[x_1,y_1]$ and $z_2=[x_2,y_2]$ are the two end zones of the parabolic segment, and $R=[R_x,R_y]$ is the point of intersection of tangents 48 and 49 (see FIG. 4).

In other words, unlike the conventional paraboloidal surface formed by rotating a parabolic generatrix around the axis of symmetry of the corresponding parabola, non-imaging surface 18 is obtained by rotating its generatrix 40 around axis 24 which is generally disposed at an angle to the axis of symmetry 46 of the corresponding parabola.

For the ease of explanation, FIG. 4 is drawn to the same scale as FIG. 3, and generatrix 40 of non-imaging surface 18 is selected so that it is disposed approximately at the place of paraboloidal generatrix 30 shown in FIG. 3. Like numerals and symbols in each FIG. 4 and FIG. 3 refer to like elements. For the purpose of clarity, target plane 26 is selected to be at the place of focal plane of the paraboloid formed by generatrix 30. By way of example, a secondary, concave, cone-like concentrator can be provided as receiver 16 for further intensification of the energy flux formed by concentrator 12. In the example shown, receiver 16 is a secondary concentrator which entrance aperture is indicated by lines $L_1$ and $L_2$.

Referring to FIG. 4, the incident off-axis rays $a_1$, $a'_1$, $a_2$, and $a'_2$ corresponding to the angular size of the energy source in the plane of the paper and striking edge zones $z_1$ and $z_2$ of surface 18 are reflected to points $e_1$, $e'_1$, $e_2$, and $e'_2$, respectively. The corresponding tangents 48 and 49 to the generatrix 40 at zones $z_1$ and $z_2$ can be selected so that the supreme off-axis rays $a_1$–$a_2$ and $a'_1$–$a'_2$ are reflected to the points $e_1$–$e_2$ and $e'_1$–$e'_2$ which are pairwise equidistant from center of receiver 16 with a predetermined accuracy. The on-axis rays $a_0$ and $a'_0$ are reflected to points $e_0$ and $e'_0$, respectively.

While collection of off-axis rays is improved with the non-imaging profile of surface 18, the surface 18 may have no focal point and the on-axis rays can be generally not focused exactly to the center of receiver 16 as shown in FIG. 4. However, if accounting for all incident rays from the energy source, surface 18 obtained by the rotation of its generatrix 40 around axis 24 will form at the target plane a non-image energy spot which size is limited by points $e_1$ and $e_2$. As it can be seen from FIG. 4, all supreme off-axis rays $a_1$, $a'_1$, $a_2$, and $a'_2$ fit the entrance aperture of receiver 16. As the distance between points $e_1$ or $e_2$ and the center of the entrance aperture of receiver 16 (FIG. 4) is smaller than the distance between point $p_1$ and the focal point of paraboloid 30 of FIG. 3 so that all the incident energy flux falling to surface 18 is collected to a smaller area, the net concentration for a given entrance aperture of receiver 16 is improved.

Accordingly, the profiles of other surfaces 18 of concentrator 12 can be selected being non-imaging ones in a similar way to efficiently focus the off-axis rays. The individual concentrated energy fluxes from surfaces 18 will superimpose on one another at the entrance aperture of receiver 16 thus providing more intensive flux for the secondary as compared to the case where a conventional device employing confocal truncated paraboloids is considered as a primary concentrator.

EXAMPLE 2

Figure 5:
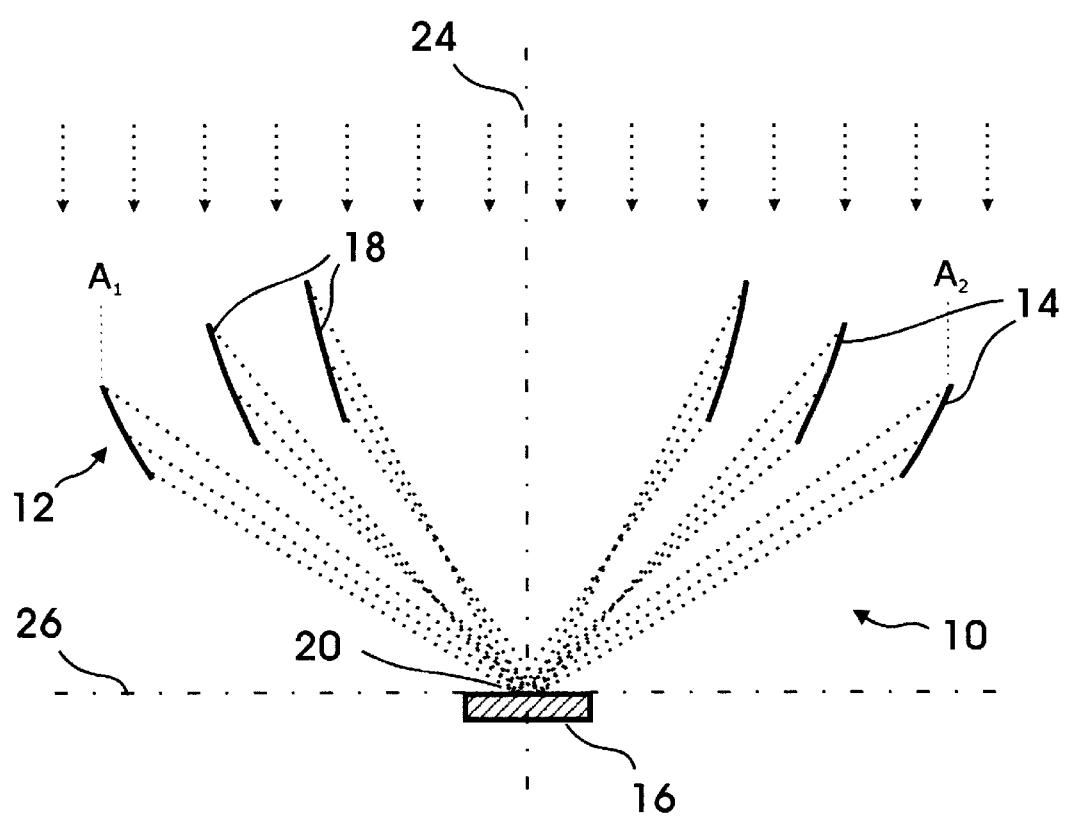
FIGS. 5–6 show examples of cross-sectional schematic views of the non-imaging system for energy flux transformation in accordance with the present invention.

FIG. 5 more fully illustrates operation of system 10 as a solar collecting system for obtaining substantially uniform illumination of receiver 16 which can be, for example, a photovoltaic panel for converting solar energy into electricity. Only three non-adjacent elements 14 are selected and shown in the cross section in FIG. 5 for the purpose of clarity. However, it should be understood that concentrator 12 can incorporate any convenient number of elements 14, limited, for example, by the required optical and dimensional parameters of system 10, and desired characteristics of energy spot 20.

Referring to FIG. 5, sunlight 50 (represented by parallel dashed lines) strikes reflective elements 14 and is reflected by surfaces 18 to the photovoltaic cells of receiver 16. The generatrices of surfaces 18 and relative dispositions of elements 14 are selected so that surfaces 18 illuminate receiver 16 by their concentrated energy beams centered relatively to each other and forming individual energy spots of approximately the same size on the photovoltaic cells. This size can be predetermined, for example, based on the desired illumination level for the photovoltaic cells and aperture of concentrator 12.

In order to equalize the sizes of energy spots from individual surfaces 18, a parabolic profile for at least one surface 18 can be selected so that the corresponding concentrated energy is intercepted by receiver 16 in a divergent (see innermost surfaces 18 in FIG. 5) or convergent beam. The superposition of same-size individual energy spots will form common energy spot 20 on receiver 16 with relatively uniform illumination level.

EXAMPLE 3

Figure 6:
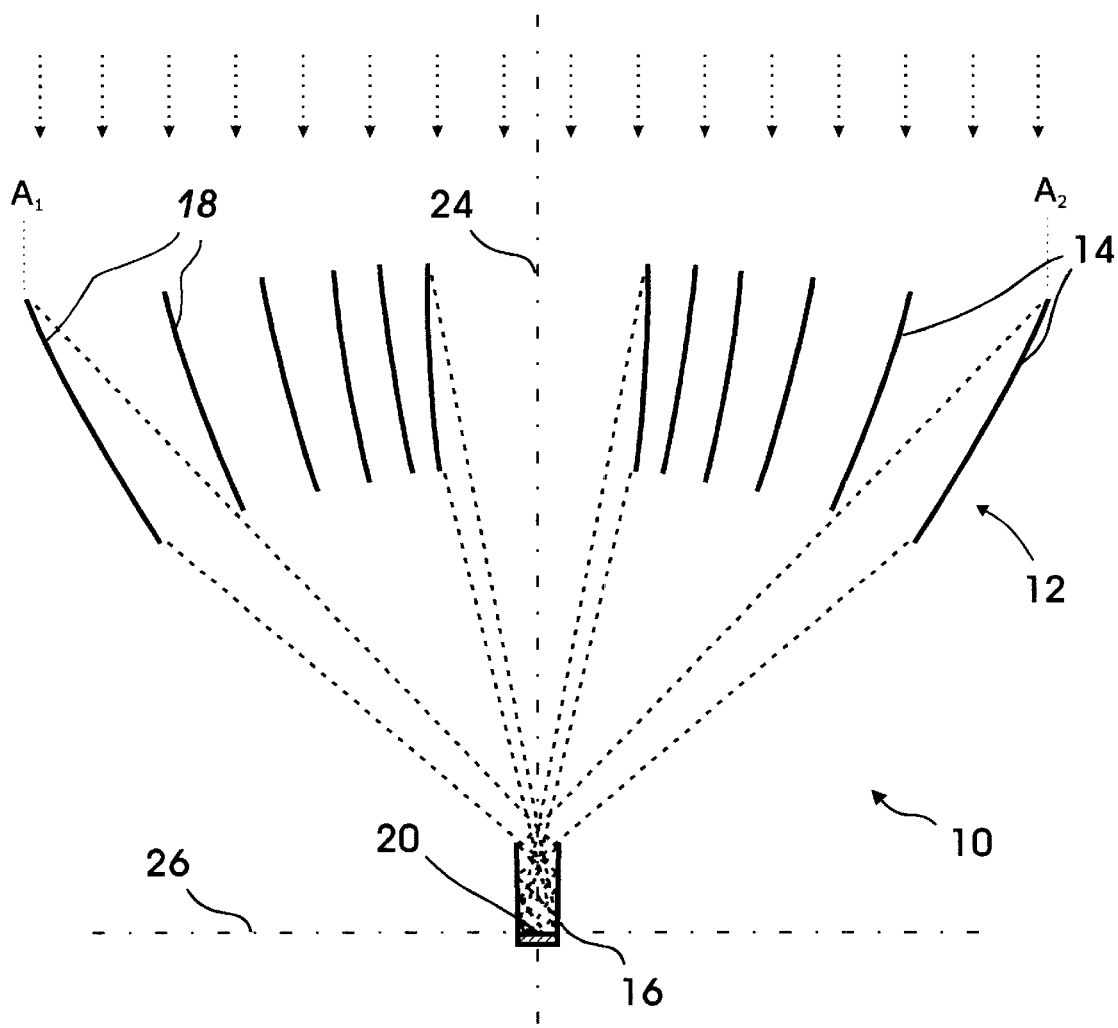

FIG. 6 illustrates an alternative approach for obtaining highly uniform energy distribution in the concentrated flux while maintaining very high energy concentration.

The desired operation is obtained by selecting non-imaging parabolic profiles for reflective surfaces 18, as in Example 1, and utilizing a secondary non-concentrating reflector as receiver 16, where the secondary reflector has a tubular shape and inner reflective surface. As shown in FIG. 6, the tubular reflector intercepting on its entrance aperture at least the central part of concentrated energy flux reflected from concentrator 12 should have enough length to ensure concentrated flux homogenization due to multiple reflections on its inner walls.

Other Embodiments

The foregoing embodiments are described upon the case when parabolic profiles for individual surfaces 18 are selected so that elements 14 form their concentrated energy beams centered relatively to each other on receiver 16. However, this invention is not only limited to this, but can be applied to the case where a non-parabolic profile for individual surface 18 can be selected so that collection of off-axis rays will be improved without impairing the accuracy of collection of on-axis rays. The geneneratrix of surface 18 can be formed by a segment of any other curve, including a segment of a circle, Bezier curve, parabolic or cubic spline, etc. For example, a spline of $2^{nd}$ or higher-order function, or a curve described by parametric equations can be selected for the generatrix of one or more surfaces 18 to satisfy the condition of minimum area of spot 20 or the condition of matching the shape and irradiance distribution in spot 20 to the shape and size of receiver 16. In addition, one or more surfaces 18 can have a profile which is a composite or combination of curved or planar segments.

Furthermore, as the illumination of central zones of receiver 16 can be typically more intensive than that of its peripheral zones, receiver 16 can be designed so that its working surface receives a predetermined-size central part of spot 20 to obtain higher peak concentration for a given receiver's area at the expense of the net concentration ratio.

In addition, surfaces 18 of one or more elements 14 can be specifically tailored so that the respective beams can be made partially overlapped, contacting, or spaced apart to provide a desired concentrated energy distribution on receiver 16.

The foregoing embodiments are described upon the case when reflective elements 14 have fixed positions relatively to each other. However, this invention is not only limited to this, but can be applied to the case where elements 14 can be moved relatively to each other and receiver 16 along the axis of symmetry of concentrator 12. This can be useful, for example, for providing different illumination regimes for receiver 16 in real time.

Generally, in the case of parabolic-profile generatrices of surfaces 18, the axis of symmetry of individual surface 18 is not restricted to coincide or even be parallel to the optical axis of a parabola which segment forms the surface 18, so that elements 14 can have no focal points and form no images. However, by way of example, one or more surfaces 18 can have optical axis of corresponding generatrix coinciding with the axis of symmetry of surface 18 to form a paraboloidal surface, and, in a further example, two or more paraboloidal surfaces 18 can share a common focal point.

The foregoing embodiments are described upon the case when concentrator 12 comprises a plurality of concentric ring-like elements 14 which surfaces 18 are obtained by 360° rotating the corresponding generatrices around an axis. However, this invention is not only limited to this, but also can be applied to the case where one or more sector-shaped elements 14 are used to form concentrator 12 (asymmetric design). For example, one-half of concentrator 12 shown in FIG. 1 can be taken for a 180° sector design of system 10. In addition, one or more individual elements 14 can be selectively added, omitted, changed or replaced in concentrator 12 to provide the application-specific operation or desired dimensions.

FIG. 1 illustrates a preferred embodiment of system 10 where the surface of receiver 16 is shown flat. However, receiver 16 can have any other spatial shape, including conical, spherical, and other concave and convex surfaces. Receiver 16 can also be a three-dimensional region of arbitrary shape, for example, if receiver 16 is a gas- or liquid-filled tube. This can be useful, in particular, for applying system 10 to high-temperature solar detoxification of hazardous gaseous products or treatment of contaminated water.

Conclusion

Accordingly, the reader will see that the system of this invention can be used for high-flux transformation and utilization of radiant energy, especially for various high-heat ground-based and space solar technologies. The system utilizes an efficient non-imaging concentrator having axial symmetry and coupled to an energy receiver, so that the concentrator and receiver cooperate to achieve the desired operation.

Although the above description contains some specificities, these should not be construed as limiting the scope of the invention but are merely providing illustrations of some of the presently preferred embodiments of this invention. While a variety of embodiments and examples has been disclosed, it will be readily apparent to those skilled in the art that numerous modifications and variations not mentioned above can still be made without departing from the spirit and scope of the invention.

What is claimed is:

1. Non-imaging system for radiant energy flux transformation comprising:

an energy concentrator comprising a plurality of non-imaging, facing inward, ring reflective surfaces being coaxially nested with respect to the axis of symmetry of said energy concentrator and having generally concave profiles, said reflective surfaces having larger rims forming an entrance aperture of said energy concentrator and smaller rims forming an exit aperture of the energy concentrator;

and an energy receiving means located in a target plane on the exit aperture side of the energy concentrator and disposed in energy receiving relation to said reflective surfaces;

wherein said reflective surfaces are designed and positioned so that opposite supreme off-axis rays emanated from the source of said radiant energy flux and reflected from a rim of at least one of said reflective surfaces strike said target plane at points located at substantially equal distances from the point of intersection of said axis of symmetry and said target plane.

2. The non-imaging system of claim 1 wherein said reflective surfaces are designed and positioned to minimize screening and shadowing on said reflective surfaces.

3. The non-imaging system of claim 1 wherein one or more said reflective surfaces is formed by rotation of a curve segment around an axis.

4. The non-imaging system of claim 3 wherein the angle of said rotation is more than about 45° and less than 360°.

5. The non-imaging system of claim 3 wherein said segment is a portion of a conical section curve.

6. The non-imaging system of claim 5 wherein said segment is parabolic.

7. The non-imaging system of claim 5 wherein said segment is circular.

8. The non-imaging system of claim 3 wherein said segment is represented by a polynomial function of at least second order.

9. The non-imaging system of claim 3 wherein said segment is represented by a parametric function or a spline tailored to provide an illumination of said energy receiving means.

10. The non-imaging system of claim 3 wherein said segment comprises a set of conjugated lines selected from the group consisting of straight, parabolic, circular, elliptical, and hyperbolic segments.

11. The non-imaging system of claim 1 wherein said energy receiving means is a heat collector.

12. The non-imaging system of claim 1 wherein said energy receiving means comprises at least one photovoltaic cell.

13. The non-imaging system of claim 1 wherein said energy receiving means is a secondary radiant energy transforming means.

14. The non-imaging system of claim 13 wherein said energy receiving means comprises a secondary radiant energy concentrator.

15. The non-imaging system of claim 13 wherein said energy receiving means comprises means for flux homogenization.

16. The non-imaging system of claim 1 wherein said energy receiving means is mechanically separated from said energy concentrator.

17. The non-imaging system of claim 1 wherein one or more said reflective surfaces is disposed in any one of a translated, a reversed and/or a rotated orientation relative to others having the same basic arrangement.

18. The non-imaging system of claim 1 further comprising at least one axle support means for tracking the movement of radiant energy source.

* * * * *